United States Patent [19]

Babano

[11] 4,288,753

[45] Sep. 8, 1981

[54] MUTING CIRCUIT WITH OPERATIONAL AMPLIFIER

[75] Inventor: Sotoaki Babano, Tokyo, Japan

[73] Assignee: Nippon Electric Company, Ltd., Tokyo, Japan

[21] Appl. No.: 70,673

[22] Filed: Aug. 29, 1979

[30] Foreign Application Priority Data

Sep. 12, 1978 [JP] Japan ................................ 53-125968

[51] Int. Cl.$^3$ ............................................. H03G 3/24
[52] U.S. Cl. ..................................... 330/51; 330/258; 330/279; 455/223
[58] Field of Search ................. 330/51, 278, 279, 284, 330/69, 252, 258; 455/218, 219, 221–225; 375/104

[56] References Cited

U.S. PATENT DOCUMENTS 3,934,206  1/1976  Holecek .......................... 455/221 X
4,017,749  4/1977  Seki et al. ........................... 330/261

OTHER PUBLICATIONS

Ritter, "Controlling OP AMP Gain with One Potentiometer", *Electronics* Jul. 31, 1972, p. 78.

*Primary Examiner*—James B. Mullins
*Attorney, Agent, or Firm*—Laff, Whitesel & Rockman

[57] ABSTRACT

An FM muting circuit has a common input terminal and uses an operational amplifier which has a pair of input terminals. The two amplifier input terminals are coupled to the common muting circuit input terminal. An electronic switch is connected between ground and one of the operational amplifier input terminals. When the muting circuit receives an input signal which is free of noise, a "high-level" control signal is developed to switch the electronic switch into a saturated condition, thereby grounding one of the operational amplifier input terminals. Thereafter, the operational amplifier amplifies only the signal applied from the common input terminal of the muting circuit to the other amplifier input terminal, with a resulting amplified output signal. However, when noise appears in the input signal received by the muting circuit, a "low-level" control signal is applied to the electronic switch and it turns off. The signal appearing at the common input terminal of the muting circuit is thereafter supplied, in phase, to both amplifier input terminals, which causes a cancellation therein. The operational amplifier output signal is then about 100dB below the conventional level, thereby effectively rejecting the signal containing noise. A resistor network at the two inputs of the operational amplifier prevents any substantial change of bias potential responsive to the electronic switch operations. The elimination of such a bias potential change also eliminates the popping noise and causes the switching operation of the muting circuit to occur very fast.

13 Claims, 4 Drawing Figures

MUTING CIRCUIT WITH OPERATIONAL AMPLIFIER

This invention relates to muting circuits for use in FM radio receivers, or the like, and more particularly to muting circuits having operational amplifiers controlled by noise in received signals.

A conventional FM radio receiver, for instance, of the type described in the U.S. Pat. No. 4,085,370, comprises a portion for receiving and demodulating an FM carrier to produce an audio signal, an audio amplifier for amplifying the audio signal, a speaker for converting the amplified audio signal to an audible sound, and switching means for detecting noise at the output of the receiving portion. The detected noise signal is used to mute or squelch the audio amplifier. In a press-to-talk transceiver, the switching means for muting the receiver is manually controlled by a press-to-talk switch rather than by being automatically controlled in response to a detected noise signal.

A specific example of a circuit for such an audio amplifier is disclosed in the U.S. Pat. No. 3,867,709 wherein a muting (squelch) switch is operated to cause a change in the base bias potential of a transistor in order to mute the audio signal. Unless effects from the change in bias potential are reduced, there would be a high-level popping noise which would appear at the output of the amplifier. This noise is due to a rapid charging and discharging of coupling capacitors.

Therefore, the amplifier has a capacitor in parallel with the muting switch in order to reduce the popping sound by controlling a time constant required for turning the switch on and off. However, this time constant muting method requires a long time to activate the amplifier and sometimes causes a mutilation of the leading portion of each of the audio signal segments.

Therefore, an object of this invention is to provide a high-speed muting circuit which is free from the above-described drawbacks.

According to this invention, an FM muting circuit amplifies and suppresses an audio signal in response to a control signal. An operational amplifier has first and second input terminals, an output terminal, and first and second power terminals. A first capacitor is connected to receive the audio signal. A first resistor is connected between the output of the first capacitor and the first input terminal. A second resistor is connected between the output of the first capacitor and the second input terminal. A bias circuit is also connected to the output of the first capacitor. A second capacitor has one terminal connected to the second input terminal. Switching means are connected to the other terminal of the second capacitor and controlled by the control signal.

The muting circuit operates this way. The switching means operates when the input signal is free of noise and a "high-level" control signal is developed, thereby grounding one of the operational amplifier input terminals. Thereafter, the operational amplifier amplifies only the signal applied from the common input terminal of the muting circuit to the other amplifier input terminal. The result is that a normally amplified output signal is produced. However, when noise appears in the input signal of the muting circuit, a "low-level" control signal is applied to the switching means and it turns off. The signal appearing at the common input terminal of the muting circuit is supplied, in phase, to both amplifier input terminals. The resulting output signal is then about 100 dB below the normal level, thereby effectively rejecting the signal containing noise. A resistor network at the two inputs of the operational amplifier prevents any substantial change of bias potential thereat. This elimination of such a potential change also eliminates a popping noise which has heretofore been troublesome. The switching of this form of muting circuit occurs very fast.

This and other objects of this invention will hereinafter be described in detail by reference to the accompanying drawings, in which.

Before entering into a discussion of the invention, it may be well to briefly review the structure and operation of the audio amplifier disclosed in the U.S. Pat. No. 3,867,709 to better highlight some of the problems solved by this invention. More particularly, a muting (squelch) switch SW in patent 3,867,709 changes the base bias potential of a transistor $Q_8$. Then, feedback through a resistor $R_7$ turns off a transistor $Q_2$ to mute the input audio signal. A popping noise then appears at the output of the amplifier because there is a rapid charging and discharging of coupling capacitors $C_2$ and $C_3$, as a result of a rapid change in the base bias voltage. To reduce or eliminate the popping sound, the amplifier has a resistor $R_9$ and a capacitor $C_6$ connected in parallel with the switch SW, to provide a time constant for turning the switch on and off. However, activation of the amplifier is delayed by this time constant with a resulting mutilation of the leading portion of each audio signal.

Figure 1:
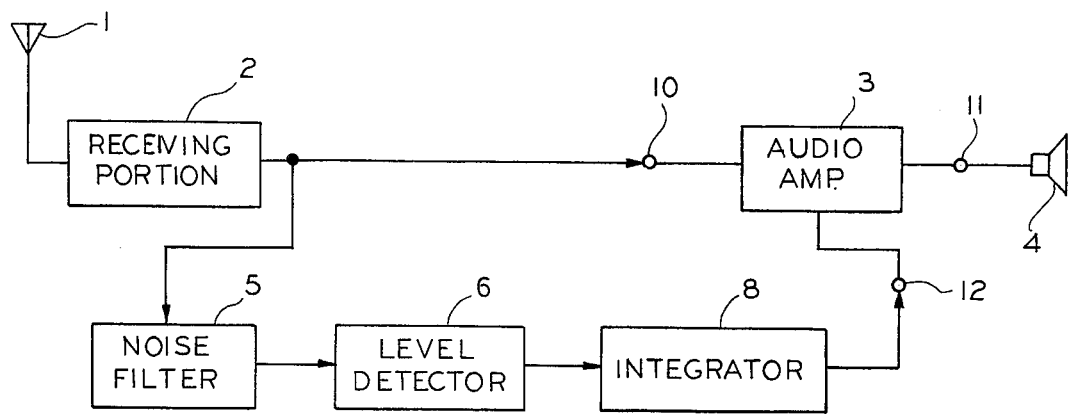
FIG. 1 is a block diagram of an FM radio receiver incorporating the muting circuit of this invention.

In FIG. 1, an FM carrier is received at an antenna or aerial 1 and supplied to a receiving portion 2, which converts the FM carrier to an intermediate frequency and reproduces an audio signal. The audio signal is amplified in an audio amplifier (or muting circuit) 3 and then supplied to a speaker 4 for conversion into sound.

The audio amplifier 3 includes a muting (squelch) switch which is controlled by a muting (squelch) signal supplied to a terminal 12, in such a manner that for a low-level muting signal (or a high level of received noise), the amplifier 3 is muted (squelched). However, for a high-level muting signal (or a low level of received noise), the audio signal is supplied through a terminal 10 to be amplified in the amplifier 3 and delivered at an output terminal 11.

The muting signal is produced in a cascaded series comprising a noise filter 5, a level detector 6 and an integrator circuit 8. The filter 5 filters and passes the noise components included in the output of the receiving portion 2. The level detector 6 (for instance, a voltage comparator) detects the filtered noise component, if it reaches a predetermined level, to produce pulse signals which are supplied to the integrator circuit 8. The integrator circuit 8 (for example, a counter) counts the number of input pulses to produce a low-level or high-level output according to whether or not the count exceeds a predetermined number, within a predetermined period of time. The muting switch in the audio amplifier 3 is controlled responsive to these two different signal levels.

Figure 2:
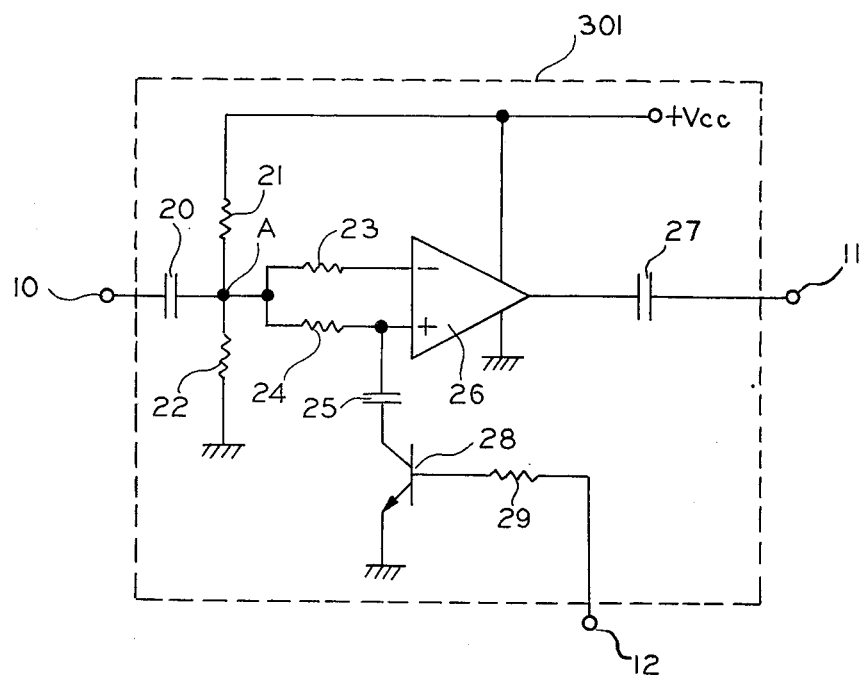
FIG. 2 illustrates a first embodiment of the muting circuit of this invention.

FIG. 2 shows one embodiment of the muting circuit 301 of this invention, which is part of the audio amplifier 3 of FIG. 1. In FIG. 2, muting circuit 301 is comprised of a pair of coupling capacitors 20 and 27, bias resistors 21 and 22, resistors 23, 24 and 29, a capacitor 25, an operational amplifier 26 and a muting transistor 28.

If a high-level signal (i.e., the output audio signal is at a high level because little or no noise is present) is supplied to the terminal 12, the transistor 28 is turned on, and it reaches saturation. With the transistor saturated, the audio signal supplied to the terminal 10 is fed through the capacitor 20 and resistor 23 to the inverted input terminal of the operational amplifier 26. At the same time, no audio signal is supplied to the non-inverted input of the amplifier 26 because the bypass capacitor 25 is grounded via the saturated transistor 28, and the audio signal appearing at this terminal is bypassed to ground through the resistor 24 and capacitor 25. Consequently, the audio signal is amplified by the operational amplifier 26 and supplied through the capacitor 27 to the terminal 11.

If a low-level signal (i.e., the output audio signal is at a low level because substantial noise is present) appears at the terminal 12, the transistor 28 is switched off. With this transistor off, the input audio signal is supplied to both input terminals of the operational amplifier 26, in phase with each other. Therefore, due to the common-mode rejection ratio (CMRR) of the amplifier 26, the output audio signal is about 100 dB less than the input signal in audio level.

The resistivity of each of the resistors 21 to 24 is selected to cause no substantial change in bias potential at point A (the bias potential of the operational amplifier 26), responsive to switching the transistor 28 on or off. As a result, the muting circuit of this invention produces no popping noise and achieves fast-switching operation.

Figure 3:
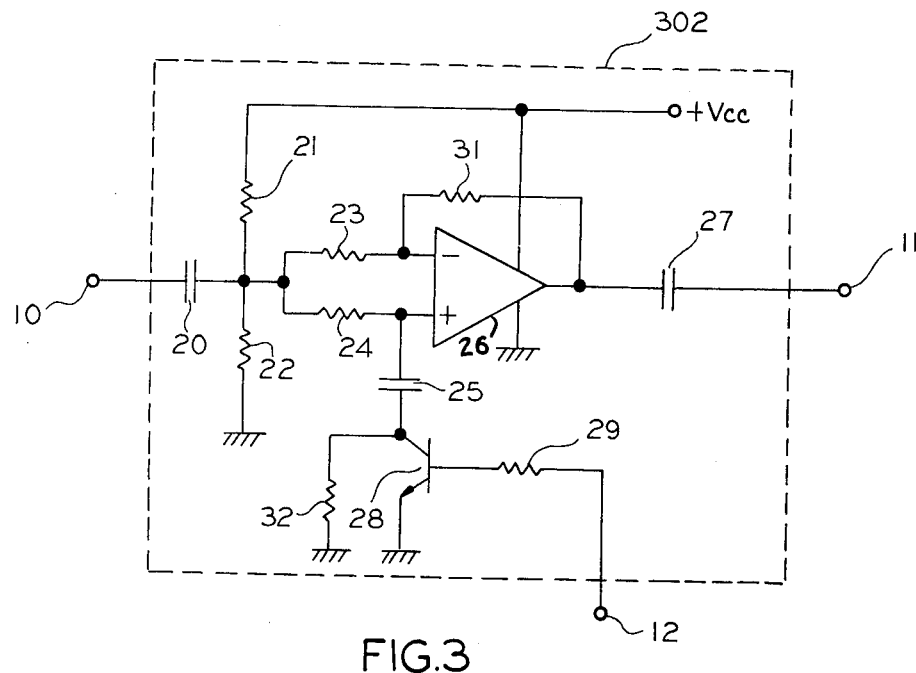
FIG. 3 illustrates a second embodiment of the muting circuit of this invention.

FIG. 3 shows a muting circuit 302 wherein a resistor 31 is used to apply a negative feedback around the operational amplifier 26 of FIG. 2. The circuit is operated in the same manner as the circuit of FIG. 2 except that, to provide the same voltage at both input terminals of the amplifier 26 when noise is being muted, the resistivity ($R_{32}$) of a resistor 32 is set at:

$$R_{32} = (R_{24} \times R_{31})/R_{23}$$

wherein $R_{23}$, $R_{24}$ and $R_{31}$ are the resistivities of resistors 23, 24 and 31, respectively. It is to be understood that if a low CMRR (e.g., 20 dB) suffices for a practical application, the resistivity $R_{32}$ is not limited to the above formulation.

Figure 4:
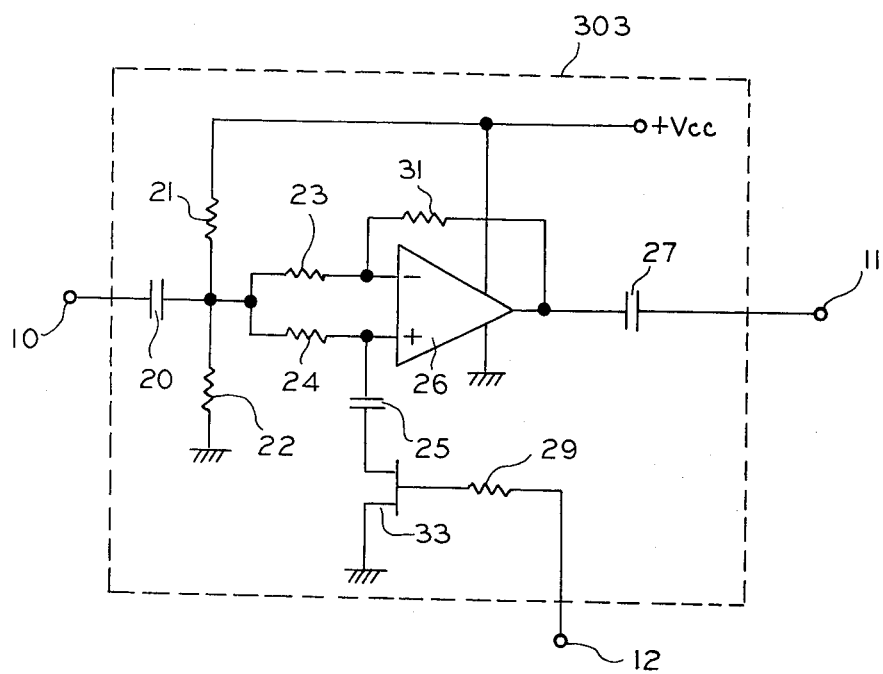
FIG. 4 illustrates a third embodiment of the muting circuit of this invention.

FIG. 4 shows another embodiment of the muting circuit of this invention wherein the transistor 28 is replaced by a field-effect transistor (FET) 33. The advantage of using the FET 33 is that the resistor 32 of FIG. 3 can be omitted. However, when it is switched on, the FET 33 needs to be given a bias which makes its resistivity equal to the resistivity of the resistor 32 (FIG. 3). The bias applied to the FET 33 may be changed to cause a variation of its resistivity, when in the ON mode. Hence, the change in resistivity causes a change in the signal level at the output of the operational amplifier 26, when in the muted mode. As a further modification, another FET may be connected in parallel with the FET 33 and a separate muting signal may be used to control the FET 33 in order to cause a change in the signal level at the output of the amplifier 26.

While the foregoing description concerns a muting circuit which controls the muting switches 28 and 33 in response to a muting signal that varies with the level of received noise signal, it is to be understood that the switches may also be controlled by the control signal from a press-to-talk switch of a press-to-talk transceiver.

As will be clear from the above description, the muting circuit of this invention has the advantages of fast switching on or off and simple circuit configuration.

Those who are skilled in the art readily perceive how to modify the system. Therefore, the appended claims are to be construed to cover all equivalent structures which fall within the true scope and spirit of the invention.

What is claimed is:

1. A muting circuit for amplifying and suppressing an audio signal in response to a control signal, said muting circuit comprising operational amplifier means having first and second input terminals, an output terminal, and first and second power terminals; a first capacitor coupled to receive said auido signal; a first resistor connected between the output of said first capacitor and said first input terminal of said operational amplifier means; a second resistor connected between the output of said first capacitor and said second input terminal of said operational amplifier means, biasing means coupled to said first and second power terminals and the output of said first capacitor; a second capacitor having one terminal connected to said second input terminal; and switching means coupled between the other terminal of said second capacitor and said second power terminal and controlled responsive to said control signal.

2. A muting circuit according to claim 1 wherein said biasing means comprises a third resistor connected between the output of said first capacitor and said first power terminal, and a fourth resistor connected between the output of said first capacitor and said second power terminal.

3. A muting circuit according to claim 1 further includes a third resistor connected between said first input terminal and said output terminal.

4. A muting circuit according to claim 3 wherein said switching means comprises transistor means having first and second electrodes coupled between the other terminal of said second capacitor and said second power terminal, and a third electrode for receiving said control signal; and a fourth resistor connected between said first and second electrodes.

5. A muting circuit according to claim 3 wherein said switching means is a field-effect transistor having first and second electrodes coupled between the other terminal of said second capacitor and said second power terminal, and a third electrode for receiving said control signal.

6. A muting circuit according to claim 3 wherein said biasing means comprises a fourth resistor connected between the output of said first capacitor and said first power terminal, and a fifth resistor connected between the output of said first capacitor and said second power terminal.

7. A muting circuit according to claim 1 further including means coupled to said first capacitor for reproducing said audio signal.

8. A muting circuit according to claim 7 further including means coupled between the output of said reproducing means and said switching means for generating said control signal corresponding to the level of noise produced at the output of said reproducing means.

9. An FM muting circuit comprising a common input terminal, operational amplifier means having a pair of input terminals coupled to the common input terminal of the muting circuit, electronic switching means connected between ground and one of the operational amplifier input terminals, control means responsive to input signals at said common input terminal when said input signals are free of noise for developing a high-level control signal which switches the electronic switching means to a condition which grounds one of the operational amplifier input terminals, whereby the operational amplifier amplifies only the signal applied from the common input terminal of said muting circuit to the other input terminal of said amplifier means, said control means responsive to noise appearing in the input signal at said common terminal for developing a low-level control signal which switches the electronic switch to a condition which enables the signal appearing at the common input terminal of said muting circuit to appear in phase at both amplifier input terminals to cause a cancellation of an output signal from said operational amplifier, thereby effectively rejecting the signal containing noise, and means at the two input terminals of the operational amplifier for preventing any substantial change of bias potential thereat responsive to switching operations of the muting circuit.

10. The muting circuit of claim 9 wherein said means for preventing substantial potential change at said two input terminals include a resistor network.

11. The muting circuit of claim 10 including means for feeding back a control signal from an output of said operational amplifier to said other input terminal.

12. The muting circuit of claim 11 including current limiting means coupled in parallel with said electronic switching means.

13. The muting circuit of claim 11 wherein said electronic switching means is a field effect transistor.

* * * * *